(12) United States Patent
Kim et al.

(10) Patent No.: US 8,779,792 B2
(45) Date of Patent: Jul. 15, 2014

(54) TESTER AND SEMICONDUCTOR DEVICE TEST APPARATUS HAVING THE SAME

(75) Inventors: Byoungjoo Kim, Hwaseong-si (KR); Inseok Hwang, Hwaseong-si (KR); Jung-Woo Kim, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 623 days.

(21) Appl. No.: 12/842,179

(22) Filed: Jul. 23, 2010

(65) Prior Publication Data

US 2011/0031992 A1 Feb. 10, 2011

(30) Foreign Application Priority Data

Aug. 7, 2009 (KR) ........................ 10-2009-0072909

(51) Int. Cl.
*G01R 31/00* (2006.01)

(52) U.S. Cl.
USPC .................................... 324/756.03

(58) Field of Classification Search
CPC .......... G01R 31/2891; G01R 31/2851; G01R 31/2831; H01L 2924/10253; H01L 2224/48227
USPC .......... 324/754.01–754.3; 257/48; 438/14–18
See application file for complete search history.

(56) References Cited

U.S. PATENT DOCUMENTS

| | | | |
|---|---|---|---|
| 7,057,406 B2 * | 6/2006 | Chang et al. | 324/750.25 |
| 7,068,056 B1 * | 6/2006 | Gibbs et al. | 324/750.16 |
| 2001/0040462 A1 | 11/2001 | Haseyama | |
| 2008/0150558 A1 | 6/2008 | Amemiya et al. | |

FOREIGN PATENT DOCUMENTS

| | | |
|---|---|---|
| JP | H08-083824 A | 3/1996 |
| JP | H09-036188 A | 2/1997 |
| JP | H11-237434 A | 8/1999 |
| JP | 2004020209 A | 1/2004 |
| JP | 2007024533 A | 2/2007 |
| JP | 2008082794 A | 4/2008 |
| JP | 2008-128935 A | 6/2008 |
| KR | 1020070104531 A | 10/2007 |

* cited by examiner

*Primary Examiner* — Tung X Nguyen
(74) *Attorney, Agent, or Firm* — Harness, Dickey & Pierce, P.L.C.

(57) ABSTRACT

Provided are a tester and a semiconductor device test apparatus having the tester. The tester includes a tested head configured to transfer electronic signals to a probe card. The tester also includes a leveling unit is provided on the tester head. The leveling unit is configured to apply a load to the probe card to maintain a level state of the probe card.

16 Claims, 12 Drawing Sheets

TESTER AND SEMICONDUCTOR DEVICE TEST APPARATUS HAVING THE SAME

CROSS-REFERENCE TO RELATED APPLICATIONS

This patent application claims priority under 35 U.S.C. §119 to Korean Patent Application No. 10-2009-0072909, filed on Aug. 7, 2009, in the Korean Intellectual Property Office (KIPO) the entire contents of which are herein incorporated by reference.

BACKGROUND

1. Field

Example embodiments relate to a tester and a semiconductor device test apparatus having the tester. Particularly, example embodiments relate to a tester for testing electrical properties of a semiconductor device and a semiconductor device test apparatus having the tester.

2. Description of Related Art

Generally, a semiconductor manufacturing process includes a fabrication (FAB) process for forming a plurality of semiconductor devices, an electric die sorting (EDS) process for testing electrical properties of each of the semiconductor devices formed on a wafer. and the semiconductor manufacturing process may also include an assembly process for packaging the semiconductor devices to protect the devices from mechanical, chemical, and physical hazards after dividing the devices that have passed the EDS process.

The EDS process may repair defective semiconductor devices and remove the semiconductor devices that cannot be repaired in early stages. Thereby, the EDS process reduces the time and costs for performing the assembly process and inspecting the packages and removing a defective cause by analyzing the defective cause of the semiconductor devices.

SUMMARY

The present disclosure provides a tester and a semiconductor device test apparatus having the tester, which can improve reliability of electrical property test of semiconductor devices.

The object of the present invention is not limited to the aforesaid, but other objects not described herein will be clearly understood by those skilled in the art from descriptions below.

Embodiments of the inventive concepts provide testers. The testers may include a tester head configured to transfer electric signals to a probe card. The tester may also include a leveling unit that is provided on the tester head. The leveling unit is configured to maintain a level state of the probe card by applying a load to the probe card.

In some embodiments, the leveling unit may include a first supporting plate disposed above the probe card in the base at a desired or predetermined space. The tester may also have an elastic member provided between the first supporting plate and the probe card. The elastic member may be configured to apply an elastic restoring force to the probe card.

In other embodiments, the elastic member may, be a spring having a first end supported by the first supporting plate and a second end supported by the probe card.

In still other embodiment, the spring may be a coil spring of which central axis is vertically disposed.

In even other embodiments, the elastic member may be an elastomer having a first end supported by the first supporting plate and a second end supported by the probe card.

In yet other embodiments, the elastomer may be an elastic rubber having a hollow shape. The elastomer may have disposed such that a central axis thereof extends in a vertical direction.

In further embodiments, the leveling unit may further include a second supporting plate disposed on a top surface of the probe card. The second supporting plate may be configured to support a lower end of the elastic member.

In still further embodiments, the leveling unit may further include a guide member inserted in a hole in the first supporting plate. and The guide member may have a lower end that is coupled to the second supporting plate. The guide member may be configured to guide a vertical movement of the second supporting plate.

In even further embodiments, the hole may be defined by a groove formed on an upper surface of the first supporting plate. The hole may be further defined by a through hole formed through a bottom surface of the groove. The guide member may include a body portion formed in a substantially rod shape and the guide member may be inserted into the through hole. A head portion of the guide member may be provided on an upper end of the body portion. The head portion of the guide member may have a larger sectional area than the through hole. and the guide member may have a coupling portion provided on a lower end of the body portion and screw-coupled to the second supporting plate.

In yet further embodiments, the hole may be formed at a central portion of the first supporting plate. A plurality of the elastic members may be provided between the first and second supporting plates. The elastic members may be symmetrically arranged with reference to a central axis of the hole.

In still yet further embodiments, the elastic member may be a spring having a first end supported by the first supporting plate. Also, the elastic member may have a second end supported by the second supporting plate.

In still yet further embodiments, the elastic member may be an elastomer having a first end supported by the first supporting plate and a second end supported by the second supporting plate.

In still further yet embodiments, opposing surfaces of the first and second supporting plates may be provided with grooves in which opposite ends of the elastic member are received.

In still further yet embodiments, the second supporting plate may be provided to support a central region of the probe card.

In other example embodiments, a leveling unit may include a first support plate provided above a probe card. The leveling unit may also have a second supporting plate provided below the first supporting plate and above the probe card. The leveling unit may include an elastic member provided between the first and the second supporting plates. The leveling unit is configured to control the elastic member to apply a load to the probe card to limit bending of the probe card.

In another example embodiment, the leveling unit is configured to control the elastic member to apply the load in an opposite direction of a force causing bending of the probe card.

In other embodiments of the inventive concept, semiconductor device test apparatus may include: a tester head configured to transfer electric signals to a probe card; a tester main body configured to input and output the electric signals to the test head; a substrate supporting unit, on which semiconductor devices for testing are provided and movable in the vertical direction toward the probe card such that electrode terminals of the semiconductor devices make contact with probes of the probe card; and a leveling unit provided on the tester head, the leveling unit configured to maintain a horizontality of the probe card by applying a load to the probe card.

In some embodiments, the tester head may include a base having an opened lower end to which the probe card is coupled; and the leveling unit may include a first supporting plate provided above the probe card in the base, the second supporting plate provided below the first supporting plate and on a top surface of the probe card, and an elastic member provided between the first and second supporting plates and applying elastic restoring force to the probe card.

In other embodiments, the leveling unit may further include a guide member provided in a hole in the first supporting plate, the guide member may have a lower end coupled to the second supporting plate, and the guide member configured to guide movement of the second supporting plate.

In still other embodiments, the hole maybe formed at a central portion of the first supporting plate; and a plurality of the elastic members may be provided between the first and second supporting plates and the elastic members may be symmetrically arranged with reference to a central axis of the hole.

According to the embodiments, the bending of the probe card is reduced, limited or prevented and thus the probes of the probe card can maintain a horizontal level state thereof.

In addition, the contact between the probes of the probe card and the electrode terminals of the semiconductor devices can be reliably realized.

Furthermore, the reliability of the electrical property inspection of the semiconductor devices can be improved.

BRIEF DESCRIPTION OF THE DRAWINGS

Example embodiments will be more clearly understood from the following brief description taken in conjunction with the accompanying drawings.

FIG. 1 is a view of a wafer on which semiconductor devices are formed;

FIG. 2 is an enlarged view illustrating a portion "A" of FIG. 1;

FIG. 3 is a schematic view of a semiconductor device test apparatus according to an example embodiment of the inventive concepts;

FIG. 4 is a perspective view illustrating a top surface of a probe card of FIG. 3;

FIG. 5 is a perspective view illustrating a bottom surface of a probe card of FIG. 3;

FIG. 6 is a cross-sectional view taken along line C-C' of FIG. 4;

FIG. 7 is an enlarged view of a portion "B" of FIG. 3;

FIG. 8 is an enlarged view of a portion "D" of FIG. 3;

FIG. 9 is a bottom view of a first supporting plate of FIG. 7;

FIG. 10 is a top-plane view of a second supporting plate of FIG. 7;

FIG. 11 is a view of a modified example of an elastic member;

FIG. 12 is a view illustrating an operation state of a leveling unit;

FIG. 13 is a view illustrating a load applied to a probe card according to a related art;

FIG. 14 is a view illustrating a load applied to a probe card of FIG. 12;

FIG. 15 is a view illustrating a state where a second supporting plate and a probe card are displaced; and FIG. 16 is a view illustrating a leveling unit according to another example embodiment of the inventive concepts.

DETAILED DESCRIPTION OF THE EMBODIMENTS

Figure 1:
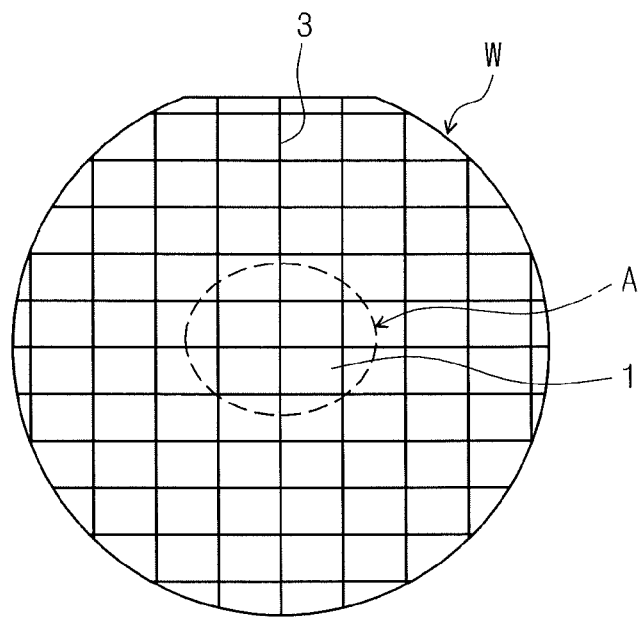
FIGS. 1-16 represent non-limiting, example embodiments as described herein.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These tutus are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
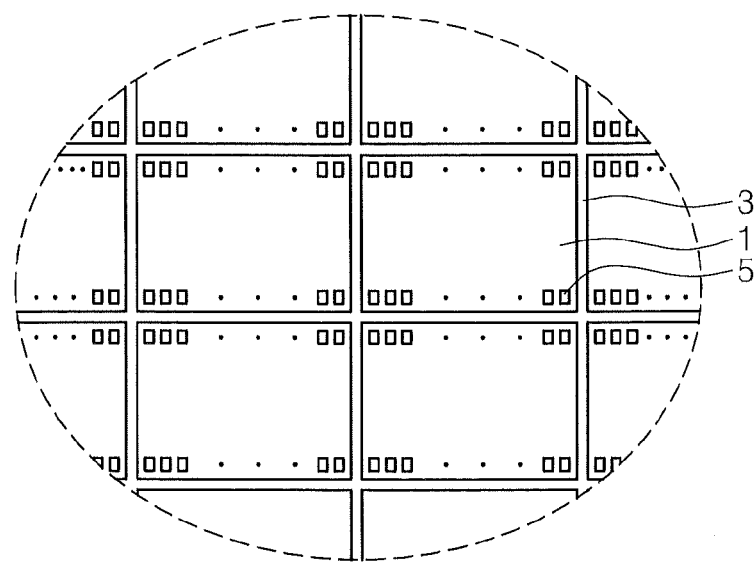

FIG. 1 is a view of a wafer on which semiconductor devices may be formed and FIG. 2 is an enlarged view illustrating a portion "A" of FIG. 1.

Referring to FIGS. 1 and 2, a plurality of semiconductor devices 1 are formed on a wafer W through a fabrication (FAB) process. The semiconductor devices 1 are separated from each other along scribing lines 3 and made in individual chip units.

An electric die sorting (EDS) process for testing electrical properties of the semiconductor devices on the wafer W is performed between the FAB process and an assembly process. In the EDS process, electric signals are applied to electrode terminals 5 formed along an outermost or peripheral portion of the semiconductor devices 1 on the wafer W. Also, the EDS may determine whether at least one of the plurality of semiconductor devices 1 is defective in accordance with the signals checked from the electric signals applied.

The following will describe a semiconductor device test apparatus used in the EDS process.

Figure 3:
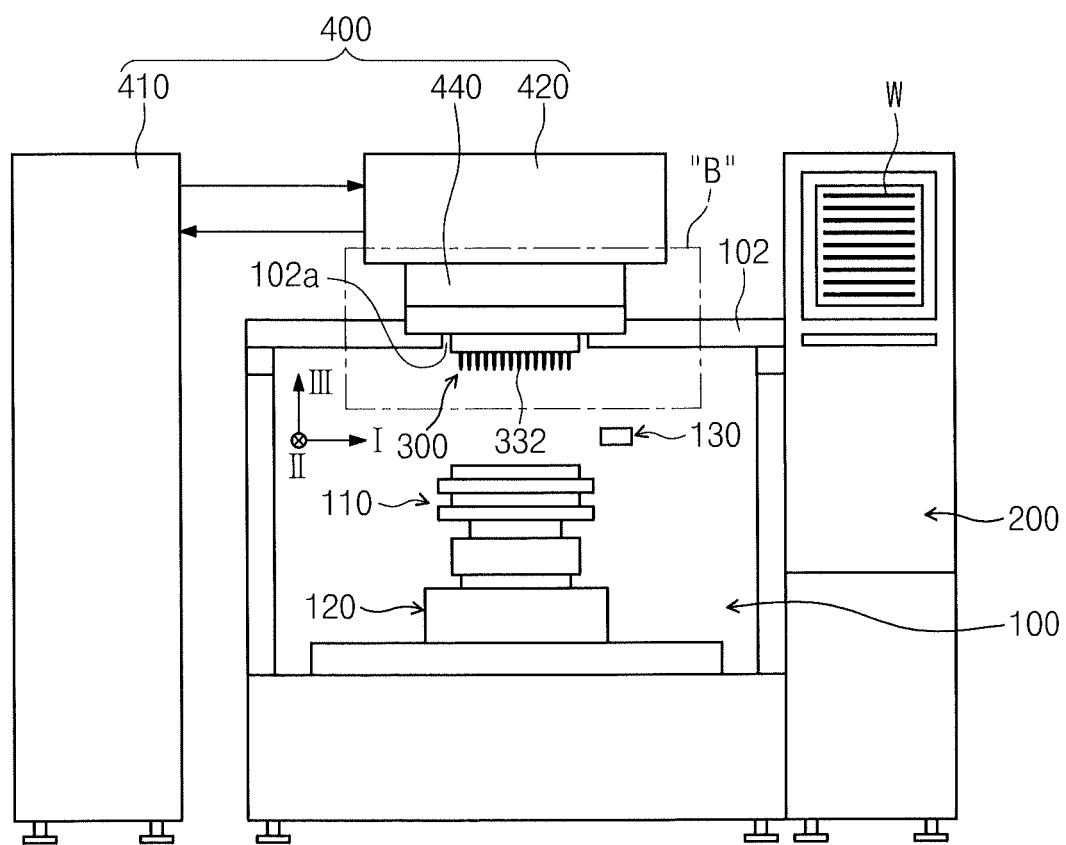

FIG. 3 is a schematic view of a semiconductor device test apparatus according to an example embodiment of the inventive concepts. Referring to FIG. 3, a semiconductor device test apparatus 10 includes a probe chamber 100, a loader chamber 200, a probe card 300, and a tester 400.

The probe chamber 100 provides a space in which the EDS process for testing the electrical properties of the semiconductor devices is performed. A loader chamber 200 is disposed adjacent to the probe chamber 100. The loader chamber 200 receives the wafer W to be tested and transfers the wafer W to the probe chamber 100.

A substrate supporting unit 110 may be disposed in the probe chamber 100. The probe card 300 may be arranged in a hole 102a formed through an upper wall 102 of the probe chamber 100 to face the substrate supporting unit 110. The wafer transferred from the loader chamber 200 is disposed on the substrate supporting unit 110. The wafer is disposed on the substrate supporting unit 110 such that a main surface of the wafer on which an electrode terminal is formed is oriented upward.

The substrate supporting unit 110 is installed on a transfer member 120. The transfer member 120 may linearly move the substrate supporting unit 110 in horizontal directions I and II. The transfer member 120 may also move linearly move the substrate supporting unit 110 in a vertical direction III and may rotate the substrate supporting unit 110 about a self-axis normal to a flat surface of the wafer. In an example embodiment, the horizontal directions I and II are directions in which the semiconductor devices are arranged on the flat surface of the wafer and the vertical direction III is a direction normal to the flat surface of the wafer.

If the transfer member 120 rotates the substrate supporting unit 110, the electrode terminals of the semiconductor devices on the wafer are aligned with probes 332 of the probe card 300. If the transfer member 120 moves the substrate supporting unit 110 in the horizontal directions I and II, the electrode terminals of the semiconductor devices on the wafer may be aligned under the probes 332 of the probe card 300. If the transfer member 120 linearly moves the substrate supporting unit 110 in the vertical direction III, the electrode terminals of the semiconductor devices on the wafer may physically contact the probes 332 of the probe card 300.

A contact mark is formed on each of the electrode terminals by the physical contact between the probes 332 and the electrode terminals. A photographing unit 130, such as a direct probe sensor (DPS) camera, may be used to identify the contact marks. The photographing member 130 may be provided at a side of the substrate supporting unit 110. The photographing member 130 may take a picture of surfaces of the electrode terminals to attain image data of the electrode terminals. The image data are transferred to a control unit (not shown) and the control unit determines whether the contact marks are formed at desired locations or whether the contact marks are defective due to the poor contact.

The tester 400 includes a tester main body 410 and a tester head 420. The tester main body 410 is disposed at a side of the probe chamber 100. The tester main body 410 outputs electric signals for testing the semiconductor devices. The tester main body may 410 may also receive electric signals corresponding to the test results to determine if the semiconductor devices functionally and/or normally operate. The tester head 420 may be electrically connected to the tester main body 410. The tester head 420 has a base 440 to which the probe card 300 is connected. The tester head 420 transfers the electric signals between the probe card 300 connected to the base 440 and the tester main body 410.

The wafer is transferred from the loader chamber 200 to the probe chamber 100. The wafer transferred to the probe chamber 100 is disposed on the substrate supporting unit 110. The transfer member 120 may rotate and horizontally move the substrate supporting unit 110 to align the electrode terminals of the semiconductor devices on the wafer with the probes 332 of the probe card 300. The transfer member 120 may vertically move the substrate supporting unit 110 to allow the electrode terminals of the semiconductor devices to contact the probes 332 of the probe card 300.

The tester main body 410 outputs electric signals desired or required for testing electrical properties of the semiconductor devices. The tester head 420 transfers the outputted electric signals from the tester main body 410 to the probe card 300. The electric signals transferred to the probe card 300 are applied to the semiconductor devices through the electrode terminals contacting the probes 332. The semiconductor devices operate in accordance with the electric signals applied thereto and the semiconductor devices output electric signals corresponding to the test results. The electric signals corresponding to the test results from the electrode terminals are transferred to the probe card 300 through the probes 332 contacting the electrode terminals. The probe card 300 transfers the electric signals corresponding to the test results to the tester head 420. The tester main body 410 receives the electric signals corresponding to the test results from the test head 420 and determines if the semiconductor devices functionally and/or normally operate.

Figure 4:
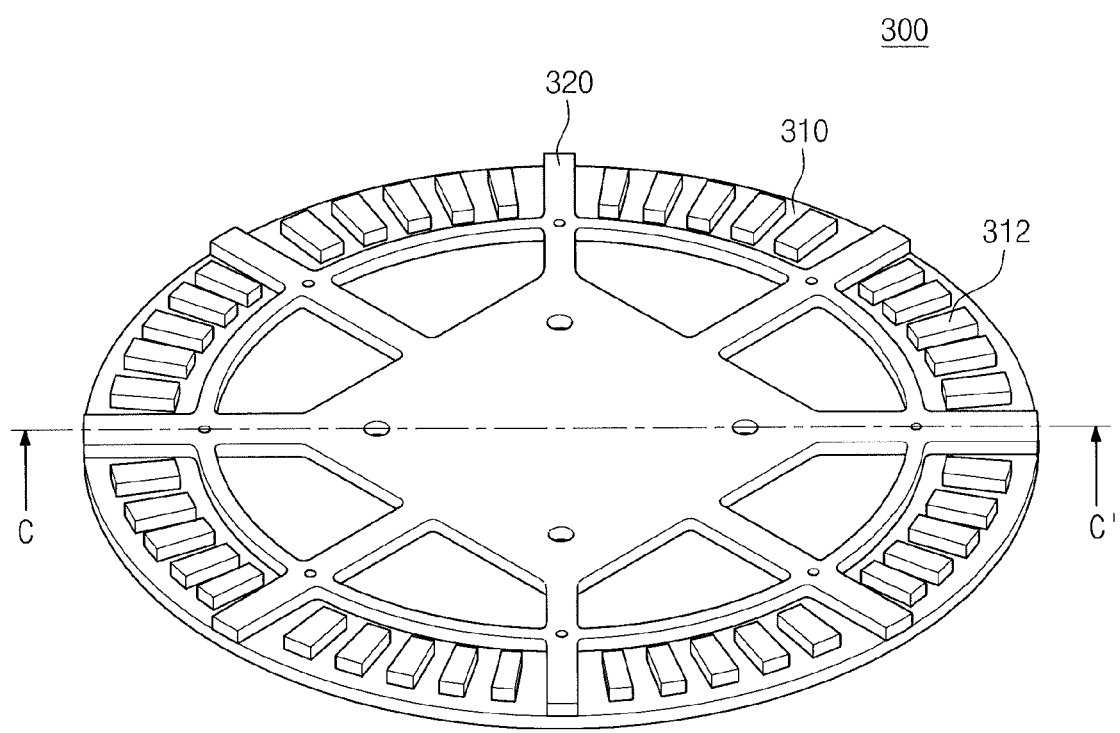
Figure 5:
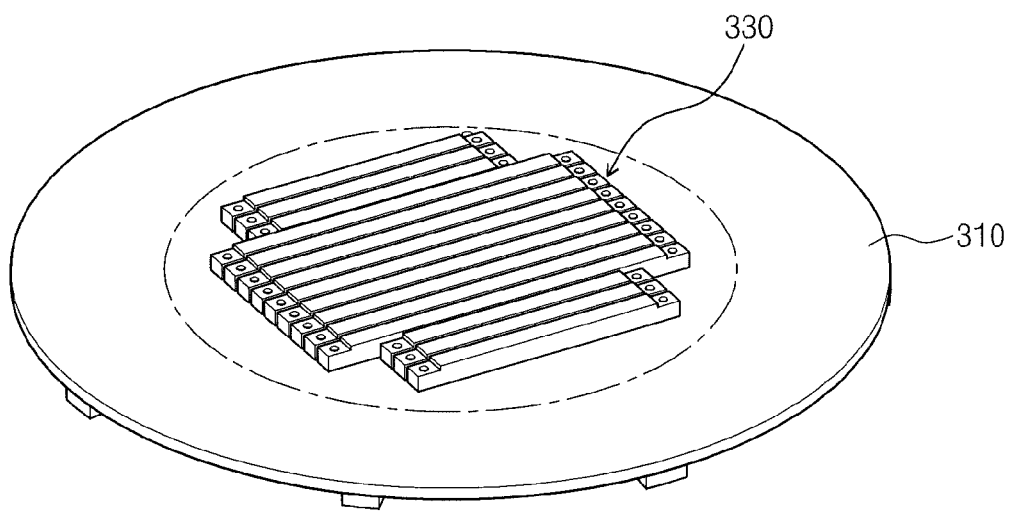
Figure 6:
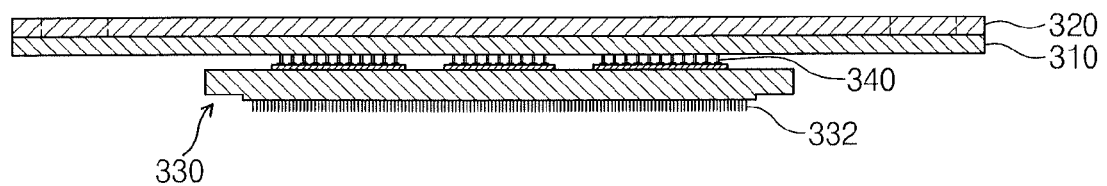

FIG. 4 is a perspective view illustrating a top surface of the probe card of FIG. 3. FIG. 5 is a perspective view illustrating a bottom surface of the probe card of FIG. 3. FIG. 6 is a cross-sectional view taken along line C-C' of FIG. 4.

Referring to FIGS. 4 to 6, the probe card 300 may have a disk-shaped main circuit board 310. The main circuit board 310 may be formed of glass epoxy resin. Circuit wirings are formed on the main circuit board 310. A reinforcing member 320 for limiting, reducing or preventing the deformation such as bending and twisting of the main circuit board 310 is installed on the top surface of the main circuit board 310. Connectors 312 are arranged on an outermost or peripheral portion of the top surface of the main circuit board 310.

Probe blocks 330 may be formed in a substantially rod shape. The Probe blocks 330 may have rows or columns provided on a bottom surface of the main circuit board 310. The probe blocks 330 are connected to the main circuit board 310 by an interposer 340. The probes 332 that physically contact the electrode terminals of the semiconductor devices to be tested are provided on bottom surfaces of the probe blocks 330.

Figure 7:
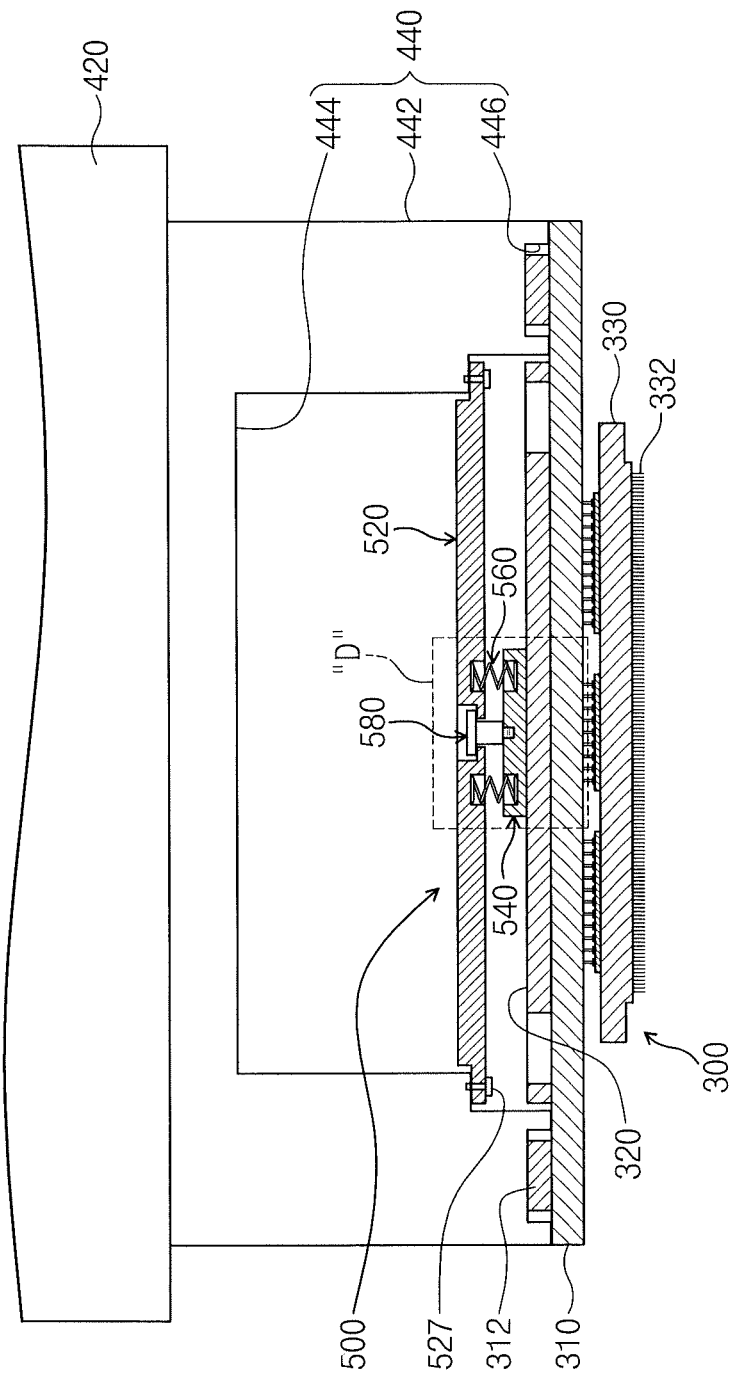

FIG. 7 is an enlarged view of a portion "B" of FIG. 3.

Referring to FIG. 7, the base 440 may be formed in a substantially cylindrical shape having an opened lower end. Connectors 446 are provided on the bottom surface of the base 440. The connectors 446 of the base 440 are paired with the respective connectors 312 of the probe card 300 in a male-female relationship. The probe card 300 may be coupled to the base 440 and close the opened lower end of the base 440. At this point, the connectors 312 of the probe card 300 are coupled to the respective connectors 446 of the base 440.

In a state where the probe card 300 is coupled to the base 440 of the tester head 420, the substrate supporting unit 110 (FIG. 3) may move toward the probe card 300 by the transfer member 120 (FIG. 3). Then, the electrode terminals of the semiconductor devices on the wafer W disposed on the substrate supporting unit 110 contact the probes 332 of the probe card 300 to perform the EDS process for testing the electrical properties of the semiconductor devices.

A leveling unit 500 may be installed inside the base 440. The leveling unit 500 applies a load in an opposite direction to a force causing bending of the probe card 300 to maintain a horizontal, plane, or substantially level state of the probe card 300.

The leveling unit 500 includes a first supporting plate 520, a second supporting plate 540, an elastic member 560, and a guide member 580. The first supporting plate 520 is disposed above the probe card 300 in the base 440 with a desired or predetermined space there between and coupled to an inner surface of the sidewall 442 of the base 440. The second supporting plate 540 is disposed on the top surface of the probe card 300 below the first supporting plate 520. In an example embodiment, the second supporting plate 540 may be disposed on the reinforcing member 320 of the probe card 300. The elastic member 560 is interposed between the first and second supporting plates 520 and 540. The elastic member 560 may apply an elastic restoring force to the second supporting plate 540 in a direction opposite to external force that may be created if the electrode terminals of the semiconductor devices contact the probes 332 of the probe card 300. If the external force is greater than the elastic restoring force of the elastic member 560, the second supporting plate 540 moves upward by the external force and the vertical movement of the second supporting plate 540 is guided by the guide member 580.

Figure 8:
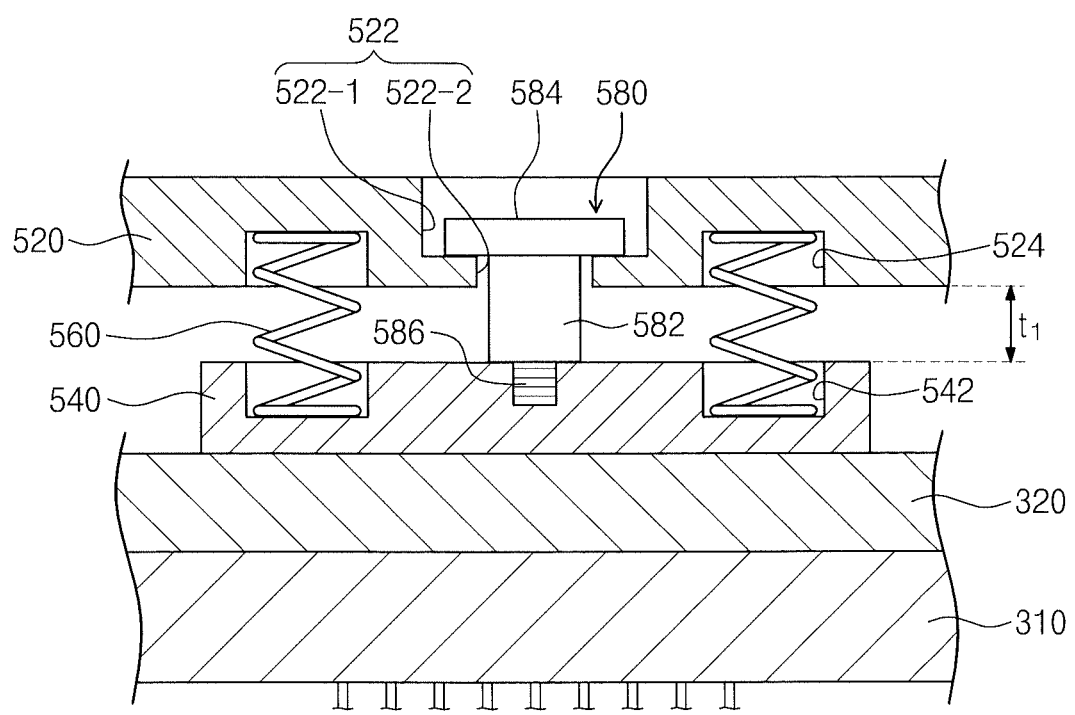
Figure 9:
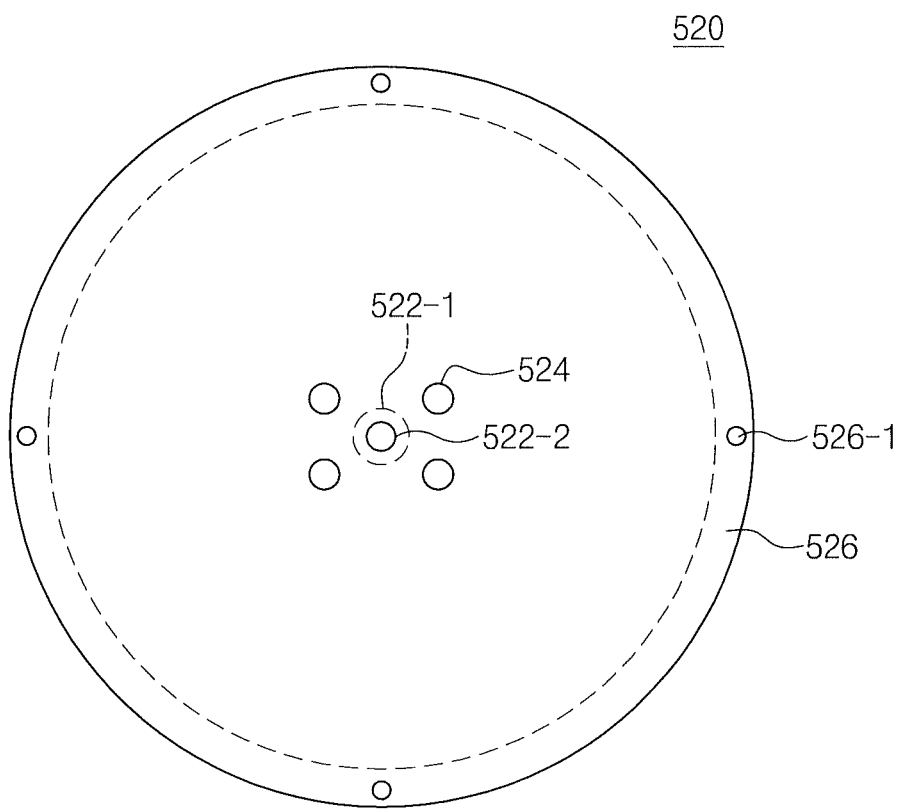
Figure 10:
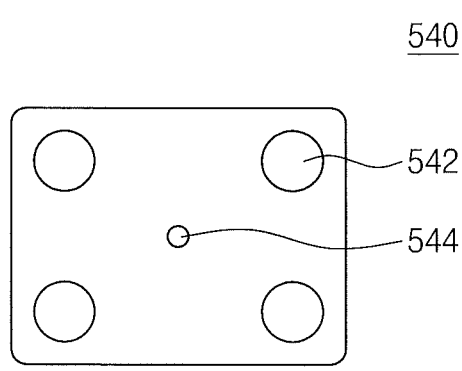

FIG. 8 is an enlarged view of a portion "B" of FIG. 3. FIG. 9 is a bottom view of a first supporting plate of FIG. 7. FIG. 10 is a top-plane view of a second supporting plate of FIG. 7.

Referring to FIGS. 8 to 10, the first supporting plate 520 may be provided in the form of a disk-shaped plate member. A hole 522 in which the guide member 580 is inserted is formed through a center of the first supporting plate 520. The hole 522 is defined by a groove 522-1 formed on a center of a top surface of the first supporting plate 520. The hole 522 is further defined by a through hole 522-2 formed through a bottom surface of the groove 522-1. The through hole 522-2 has a smaller sectional area than the groove 522-1.

A first elastic member receiving groove 524 for receiving an upper end of the elastic member 560 is formed on a surface (i.e., an under surface) of the first supporting plate 520, which faces the second supporting plate 540. A plurality of the first elastic member receiving grooves 524 may be formed and the elastic member receiving grooves may be symmetrically arranged with reference to the central axis of the hole 522. In an example embodiment, the first elastic member receiving grooves 524 may be provided to be disposed at a same distance from the center of the hole 522. Circumferential angles between the first elastic member receiving grooves 524 with reference to the center of the hole 522 may be the same as or different from each other.

A stepped portion 526 may be formed along a circumference of the periphery of the first supporting plate 520. A plurality of coupling holes 526-1 are formed in the stepped portion 526. Coupling screws 527 may be inserted into the respective coupling holes 526-1. The coupling screws 527 may be screw-coupled to the inner surface of the sidewall 442 of the base 440 so that the first supporting plate 520 can be coupled to the base 440.

The second supporting plate 540 may be provided in the form of a plate member and may have a substantially rectangular shape or circular shape, etc. The second supporting plate 540 may have an area corresponding to a central region of the probe card 300. Second elastic member receiving grooves 542 corresponding to the first elastic member receiving grooves 524 are formed on a surface (i.e., an under surface) of the second supporting plate 540, which faces the first supporting plate 520. Lower ends of the elastic members 560 are received in the respective second elastic member receiving grooves 542. The second supporting plate 540 is provided at a center thereof with a coupling hole 544 in which the guide member 580 is coupled. The coupling hole 544 may be provided with a female screw.

A plurality of the elastic members 560 may be provided. The upper ends of the elastic members 560 are received in the first elastic member receiving grooves 524 of the first supporting plate 520. The lower ends of the elastic members 560 are received in the respective second elastic member receiving grooves 542. The elastic members 560 applies elastic restoring force to the second supporting plate 540 in a direction opposite to external force that is created when the electrode terminals of the semiconductor devices contact the probes 332 (FIG. 7) of the probe card 300 (FIG. 7).

The elastic member 560 may be provided in the form of a spring. For example, the elastic member 560 may be a coil spring. The coil spring is disposed such that a central axis thereof extends in a vertical direction. The opposite ends of the coil spring are supported by the first and second elastic member receiving grooves 524 and 542.

Figure 11:
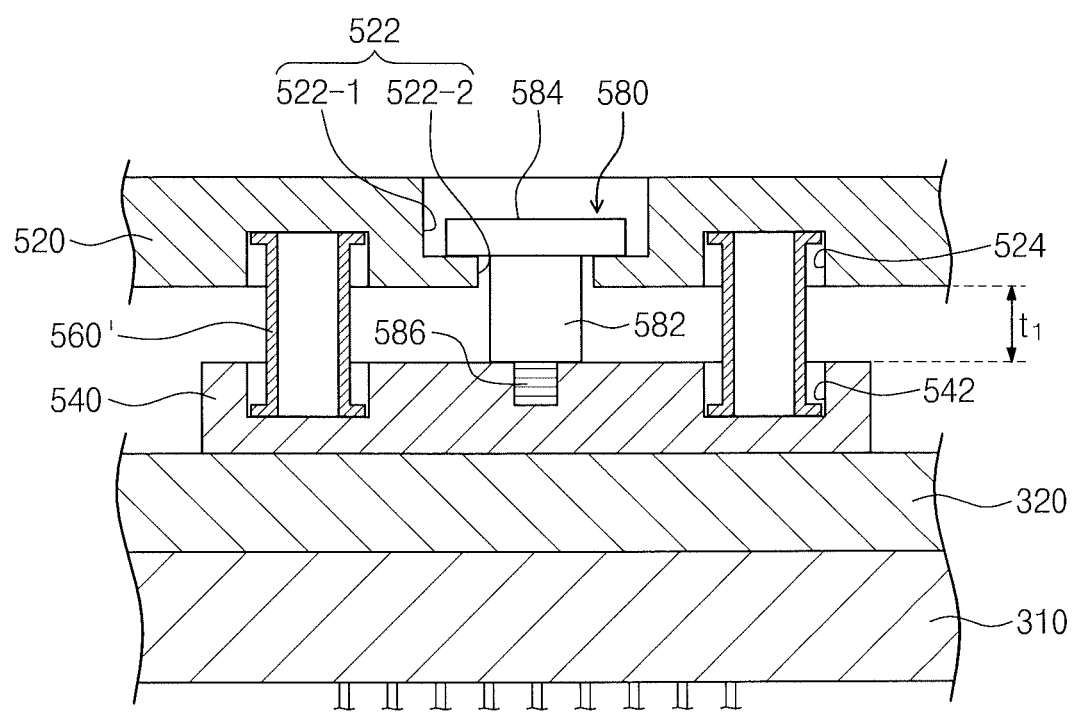

As shown in FIG. 11, the elastic member 560' may be fanned of an elastomer. In an example embodiment, the elastic member 560' may be formed of an elastic rubber material. The elastic member 560' formed of the elastomer is disposed such that a central axis thereof extends in a vertical direction. The elastic member 560' may be formed in a hollow shape. The opposite ends of the elastic member 560' are supported by the first and second elastic member receiving grooves 524 and 542. The modulus of elasticity of the elastic member 560' may be adjusted by adjusting a shape, material and wall thickness of the elastic member 560'.

The guide member 580 guides the vertical movement of the second supporting plate 540. The guide member 580 includes a body portion 582, a head portion 584, and a coupling portion 586. The body portion 582 may be formed in a rod shape and may be inserted into the through hole 522-2 of the first supporting plate 520. The head portion 584 is provided on an upper end of the body portion 582. The head portion 584 may have a larger sectional area than the through hole 522-2 so that the head portion 584 can be supported by the through hole 522-2 in an initial state. The coupling portion may be formed in a rod shape and provided on a lower end of the body portion 582. A male screw may be formed on an outer circumference of the coupling portion 586. The coupling portion 586 is screw-coupled to the coupling hole 544 of the second supporting plate 540.

The following will describe operation of the leveling unit described above.

Figure 12:
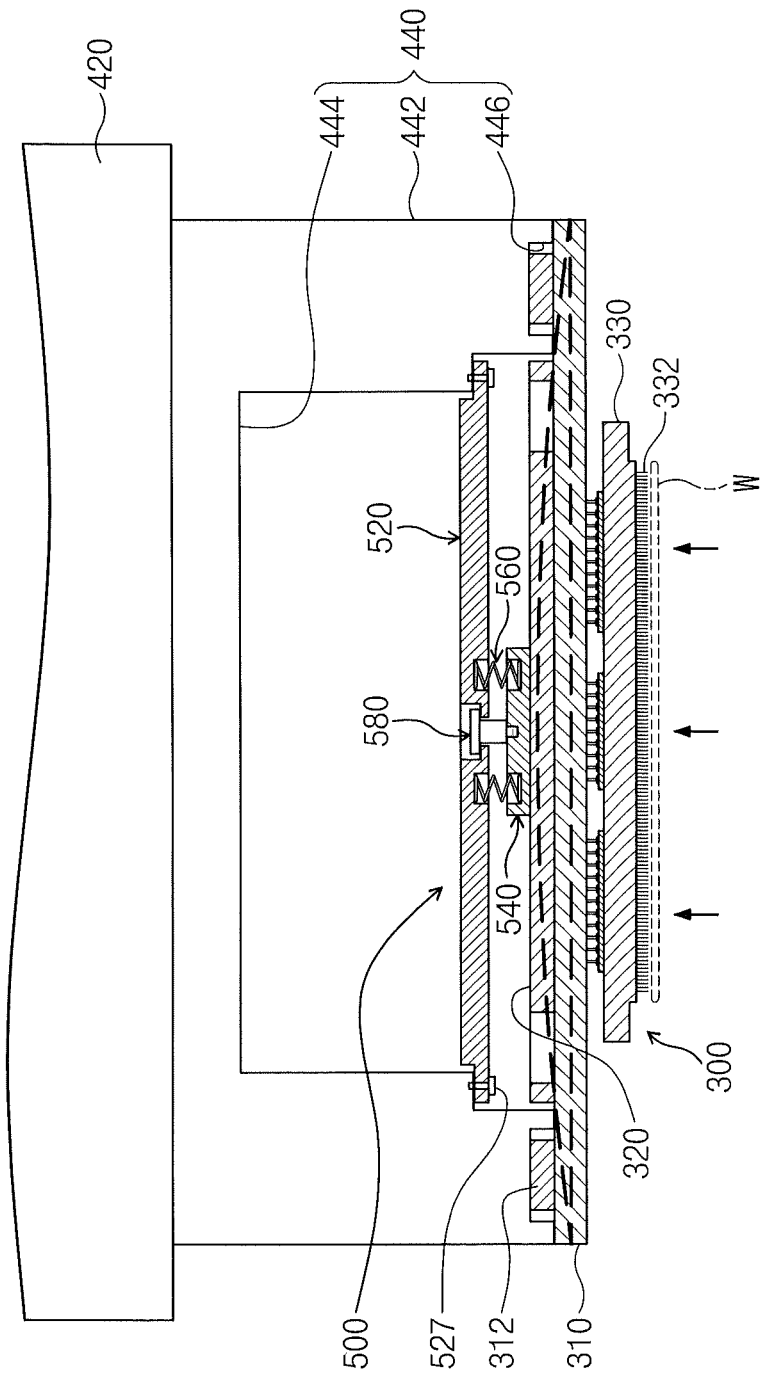
Figure 13:
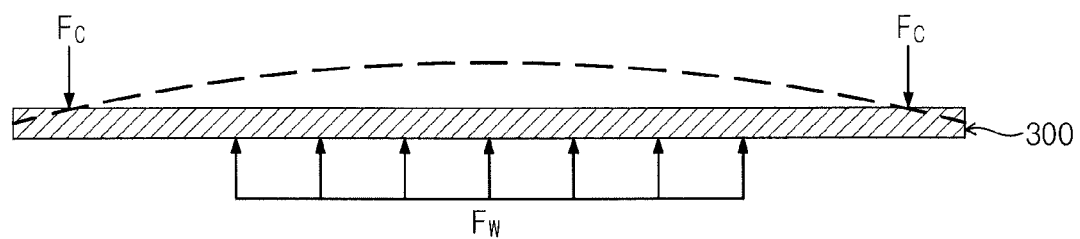
Figure 14:
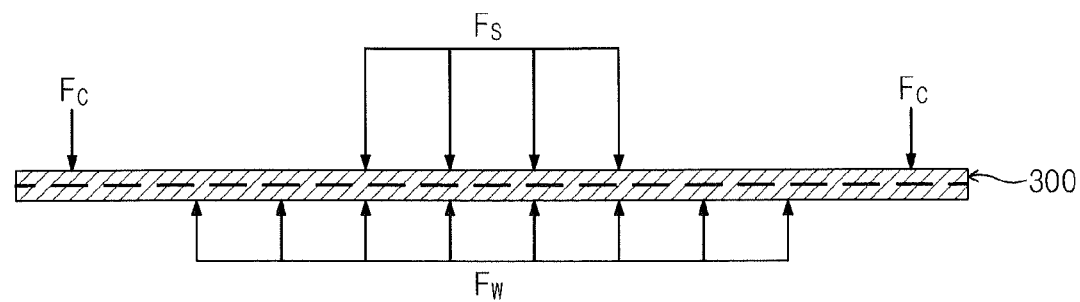
Figure 15:
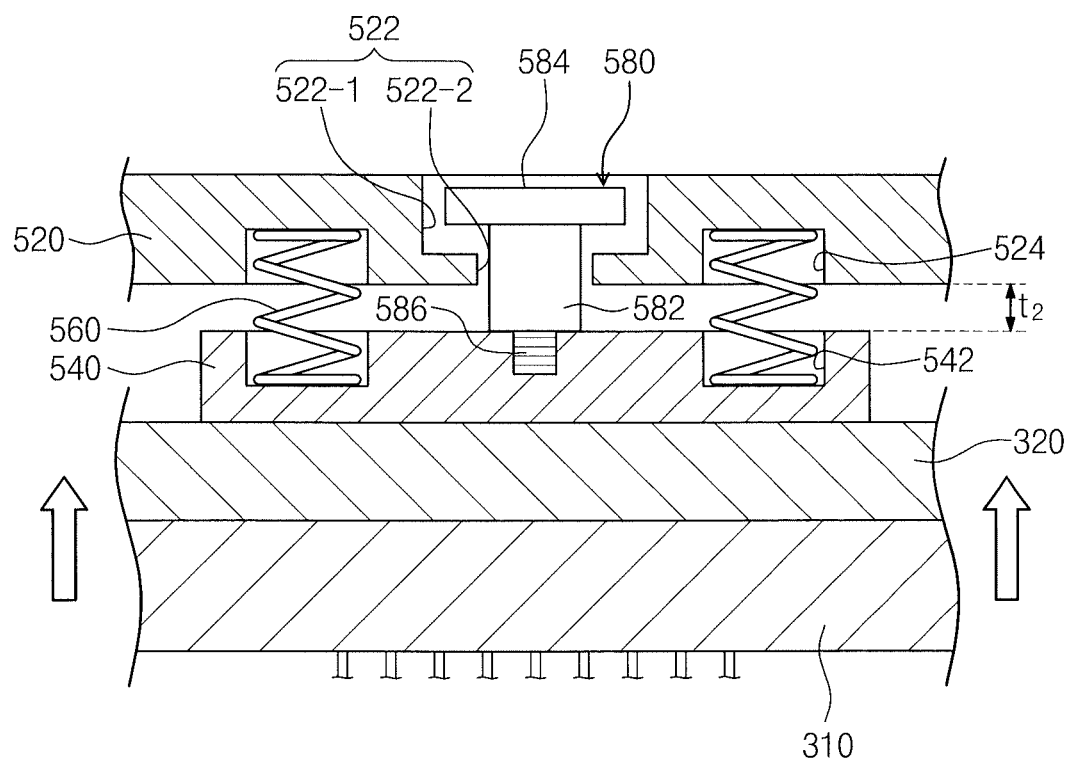

FIG. 12 is a view illustrating an operation state of a leveling unit. FIG. 13 is a view illustrating a load applied to a probe card according to a related art. FIG. 14 is a view illustrating a load applied to the probe card of FIG. 12. FIG. 15 is a view illustrating a state where the second supporting plate and the probe card are displaced.

Referring to FIGS. 12 to 15, the probe card 300 and the base 440 of the tester head 420 are coupled, such as physically coupled, to each other by the paired connectors 312 and 446 arranged along a circumference of the probe card 300 and the base 440. In an example embodiment, the wafer W on which the semiconductor devices are formed moves to contact the probes 332 of the probe card 300 for the test of the electrical properties of the semiconductor devices. Since the probe blocks 330 provided with the probes 332 are coupled to the central region of the bottom surface of the main circuit board 310, the force created by the contact between the semiconductor devices and the probes 332 act on the central region of the bottom surface of the probe card 300.

FIG. 13 shows the acting state of the load. As shown in FIG. 13, force Fw created by the contact between the semiconductor devices and the probes 332 (FIG. 12) is applied to the central region of the bottom surface of the probe card 300. Reactive force Fc against the force Fw is applied to the periphery region of the top surface of the probe card 300. The reactive force is applied at a coupling location of the connectors 312 and 446. If the force Fw is applied to the central region of the probe card 300 in a state where the periphery region of the probe card 300 are supported as described above, the probe card 300 may be bent such that the central region thereof is convex upward.

The leveling unit 500 as shown in FIG. 12 is provided to limit, prevent or reduce the bending of the probe card 300. The leveling unit 500 applies a load in an opposite direction to the direction in which the force Fw acts to maintain the level, or substantially plane state of the probe card 300. If the force Fw is applied to a lower portion of the probe card 300, as shown in FIG. 14, the elastic member 560 of the leveling unit 500 disposed above the probe card 300 applies elastic restoring force Fs to the probe card 300. Since the elastic restoring force Fs acts in an opposite direction to the direction in which the force Fw is applied compensating for the force Fw, thereby limiting, reducing or preventing the bending of the probe card 300. The elastic member 560 generating the elastic restoring force Fs has a desired or predetermined modulus of elasticity that can compensate for the force Fw.

If the force Fw is greater than the elastic restoring force of the elastic member 560, as shown in FIG. 15, the second supporting plate 540 moves upward while being guided by the guide member 580 for shock absorption. That is, if the force Fw is greater than a reference value, the probes 332 may be damaged if the probe card 300 is not deformed.

As described above, the tester and the semiconductor device test apparatus having the tester can reduce or prevent the bending of the probe card 300. Therefore, the level or substantially plane state of the probes 332 of the probe card 300 can be kept and thus the contact between the probes 332 of the probe card 300 and the electrode terminals of the semiconductor devices can be reliable. Accordingly, the reliability of the electric property test of the semiconductor devices can be improved.

Figure 16:
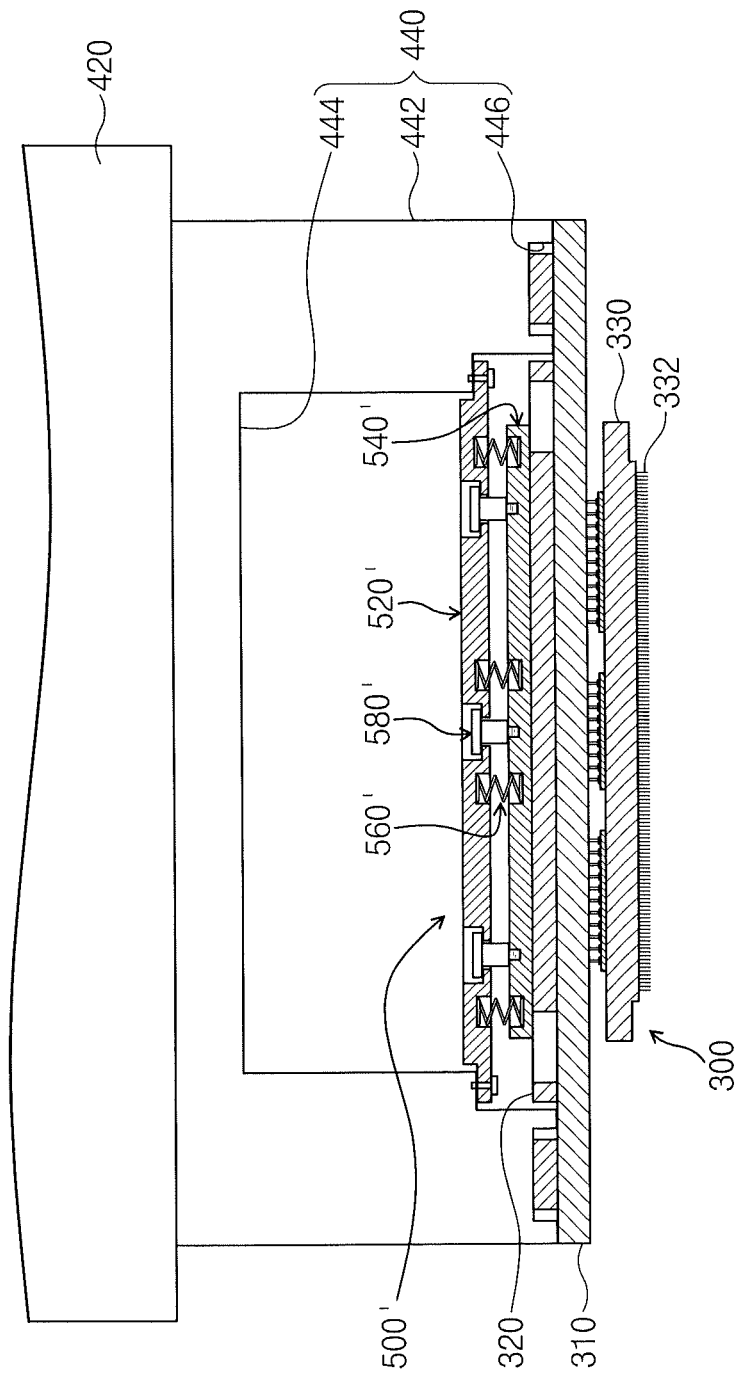

As shown in FIG. 16, the second supporting plate 540' may be provided to support an entire surface of the probe card 300. The elastic member 560' may be provided between central regions of the first and second supporting plates 520' and 540' and between periphery portions of the first and second supporting plates 520' and 540'. Also, the guide member 580' may be provided at the central regions and the periphery regions between the first and second supporting plates 520' and 540'. As described above, the leveling unit 500' maintains the horizontal, level, or substantially plane state of the probe card 300 by applying the elastic restoring force to the entire surface of the probe card 300.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts are to be determined by the broadest permissible interpretation of the following claims and their equivalents, and shall not be restricted or limited by the foregoing detailed description.

What is claimed is:

1. A tester comprising:
a tester head configured to transfer electric signals to a probe card; and
a leveling unit provided on the tester head, the leveling unit configured to maintain a horizontality of the probe card by applying a load to the probe card, the leveling unit including a first supporting plate, a second supporting plate, an elastic member, and a guide member, the first supporting plate above the probe card, the second supporting plate between the probe card and a lower end of the elastic member, the elastic member between the first supporting plate and the probe card, and the guide member in a hole in the first supporting plate,
wherein the guide member has a lower end coupled to the second supporting plate and is configured to guide movement of the second supporting plate, and the elastic member is configured to apply a restoring force to the probe card.

2. The tester of claim 1, wherein the elastic member is a spring provided between the first supporting plate and the probe card.

3. The tester of claim 2, wherein the spring is a coil spring having a vertically disposed central axis.

4. The tester of claim 1, wherein the elastic member is an elastomer provided between the first supporting plate and the probe card.

5. The tester of claim 4, wherein the elastomer is an elastic rubber having a hollow shape and the elastomer is disposed such that a central axis thereof extends in a vertical direction.

6. The tester of claim 1, wherein the hole is defined by a groove formed on an upper surface of the first supporting plate and the hole is further defined by a through hole formed at a bottom surface of the groove; and
the guide member comprises a body portion formed in a rod shape and inserted into the through hole, the guide member includes a head portion provided on an upper end of the body portion and the head portion having a larger sectional area than the through hole, the guide member includes a coupling portion provided on a lower end of the body portion, the coupling portion configured to couple the guide member to the second supporting plate.

7. The tester of claim 1, wherein the hole is formed at a central portion of the first supporting plate; and
a plurality of the elastic members are provided between the first and second supporting plates and the elastic members are symmetrically arranged with reference to a central axis of the hole.

8. The tester of claim 7, wherein the plurality of elastic members are springs having a first end supported by the first supporting plate and a second end supported by the second supporting plate.

9. The tester of claim 7, wherein the plurality of elastic members are elastomers having a first end supported by the first supporting plate and a second end supported by the second supporting plate.

10. The tester of claim 7, wherein opposing surfaces of the first and second supporting plates are provided with grooves in which opposite ends of the elastic member are received.

11. The tester of claim 7, wherein the second supporting plate is provided to support a central region of the probe card.

12. A tester comprising:
a leveling unit including a first supporting plate provided above a probe card, a second supporting plate provided below the first supporting plate and above the probe card, a guide member in a hole in the first supporting plate, and an elastic member provided between the first and the second supporting plates, the leveling unit configured to control the elastic member to apply a load to the probe card to limit bending of the probe card,
wherein the guide member has a lower end coupled to the second supporting plate and is configured to guide movement of the second supporting plate.

13. The tester of claim 12, wherein the leveling unit is configured to control the elastic member to apply the load in an opposite direction of a force causing bending of the probe card.

14. A semiconductor device test apparatus comprising:
a tester head configured to transfer electric signals to a probe card;
a tester main body configured to input and output the electric signals to the test head;
a substrate supporting unit, on which semiconductor devices for testing are provided and movable in the vertical direction toward the probe card such that electrode terminals of the semiconductor devices make contact with probes of the probe card; and
a leveling unit provided on the tester head, the leveling unit configured to maintain a horizontality of the probe card by applying a load to the probe card, the leveling unit including a first supporting plate above the probe card in a base, the second supporting plate below the first supporting plate and on a top surface of the probe card, a guide member in a hole in the first supporting plate, and an elastic member between the first and second supporting plates and configured to apply elastic restoring force to the probe card,
wherein the guide member has a lower end coupled to the second supporting plate and is configured to guide movement of the second supporting plate.

15. The semiconductor device test apparatus of claim 14, wherein the tester head comprises the base having an opened lower end to which the probe card is coupled.

16. The semiconductor device test apparatus of claim 14, wherein the hole is formed at a central portion of the first supporting plate; and
a plurality of the elastic members are provided between the first and second supporting plates and the elastic members are symmetrically arranged with reference to a central axis of the hole.

* * * * *